(12) United States Patent
Hsu et al.

(10) Patent No.: US 7,884,363 B2
(45) Date of Patent: Feb. 8, 2011

(54) ELECTRONIC-INK DISPLAY APPARATUS AND THE MANUFACTURING METHOD THEREOF

(75) Inventors: Yu-Chen Hsu, Hsinchu (TW); Chi-Ming Wu, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 650 days.

(21) Appl. No.: 11/846,941

(22) Filed: Aug. 29, 2007

(65) Prior Publication Data
US 2008/0142801 A1    Jun. 19, 2008

(30) Foreign Application Priority Data
Dec. 15, 2006   (TW) ............................... 95147216 A

(51) Int. Cl.
G09G 3/34    (2006.01)
H01L 33/02   (2010.01)
(52) U.S. Cl. .................. 257/59; 345/107; 359/296; 257/E33.001
(58) Field of Classification Search .............. 257/59, 257/E33.001; 345/107; 359/296
See application file for complete search history.

(56) References Cited

U.S. PATENT DOCUMENTS 6,982,178 B2 * 1/2006 LeCain et al. ............... 438/22
2003/0209983 A1 * 11/2003 Harada ....................... 313/586
2005/0227397 A1 * 10/2005 Kato et al. ..................... 438/30
2006/0267016 A1 * 11/2006 Ahn et al. ..................... 257/59

FOREIGN PATENT DOCUMENTS

| CN | 1479342 A | 3/2004 |
|----|-----------|--------|
| JP | 63017429 | 1/1998 |
| JP | 2003172953 A | 6/2003 |
| JP | 2003331743 A | 11/2003 |
| KR | 20000001014 | 1/2000 |

* cited by examiner

Primary Examiner—Lynne A Gurley
Assistant Examiner—Colleen A Matthews
(74) Attorney, Agent, or Firm—Peter A. Nieves; Sheehan Phinney Bass + Green PA

(57) ABSTRACT

An electronic-ink display apparatus is provided. The electronic-ink display apparatus includes a thin film transistor (TFT) array substrate, an electronic-ink layer, a common electrode, a second substrate and an edge sealant. The TFT array substrate includes a first substrate and a dielectric layer located above the first substrate. The electronic-ink layer, common electrode and second substrate are located above TFT array substrate in sequence. The edge sealant surrounds the electronic-ink layer and at least one part of the edge sealant is not overlaid above the dielectric layer.

5 Claims, 8 Drawing Sheets

ELECTRONIC-INK DISPLAY APPARATUS AND THE MANUFACTURING METHOD THEREOF

RELATED APPLICATIONS

This application claims priority to Taiwan Application Serial Number 95147216, filed Dec. 15, 2006, which is herein incorporated by reference.

BACKGROUND

1. Field of Invention

The present invention relates to display apparatus and the manufacturing method thereof. More particularly, the present invention relates to electronic-ink display apparatus and the manufacturing method thereof.

2. Description of Related Art

The active matrix electronic-ink display apparatus conventionally includes a substrate, a common electrode, an electronic-ink layer, and a thin film transistor array substrate. The electronic-ink layer includes plural electronic-ink particles. The electronic-ink particle is a reflective display material having a bi-stable characteristic and using charged particles to provide display. Each charged particle may contain single polarity or both positive and negative polarities. When an image signal is input into the electronic-ink display apparatus, the electric field between the common electrode and the pixel electrode of the TFT array substrate is altered, and the electronic-ink particles are moved, and an image according to the image signal is therefore displayed. The image displayed by the electronic-ink display apparatus can still be retained on the display even after the power supply is removed.

FIG. 1A shows a cross-sectional view of a conventional electronic-ink display apparatus. FIG. 1B shows a vertical view of a thin film transistor array substrate of the electronic-ink display apparatus shown in FIG. 1A. Referring to FIG. 1A and FIG. 1B, the electronic-ink display apparatus 10 includes a thin film transistor array substrate 20, an electronic-ink layer 30, a common electrode 44, a second substrate 42 and an edge sealant 50. The thin film transistor array substrate 20 includes a first substrate 21, plural scan lines 22, plural data lines 23, plural thin film transistors 24 and plural pixel electrodes 26. Each thin film transistor includes a gate electrode 24a, a semiconductor layer 24b, a source electrode 24c, a drain electrode 24d and a gate insulating layer 27. A dielectric layer 25 covers the scan lines 22, data lines 23 and thin film transistors 24. The dielectric layer 25 includes plural openings H. Each opening exposes part of the thin film transistor 24. The pixel electrodes 26 are located on the dielectric layer 25. Each pixel electrode 26 is electrically connected to each thin film transistor 24 through the opening H. The electronic-ink layer 30, common electrode 44 and second substrate 42 are located above the thin film transistor array substrate 20 in sequence. The edge sealant 50 surrounds the electronic-ink layer 30 and is totally overlaid above the dielectric layer 25.

The electronic-ink display apparatus 10 is conventionally manufactured by following procedures. A front plane laminate (FPL) including the electronic-ink layer 30, common electrode 44 and second substrate 42 is disposed above the thin film transistor array substrate 20 after the thin film transistor array substrate 20 is formed. An edge sealant 50 which can be solidified by electromagnetic radiation such as ultraviolet (UV) light or visible light is subsequently coated on the side wall of the electronic-ink layer 30. Finally, the edge sealant 50 is irradiated with UV light or visible light to carry out the curing reaction of the edge sealant 50.

A protective sheet 43 slightly larger than the front plane laminate is usually disposed above the front plane laminate and covers the front plane laminate. The material of the protective sheet 43 and the dielectric layer 25 are capable of shielding electromagnetic radiation such as UV light. Therefore, UV light irradiating from the location below the thin film transistor array substrate 20 is shielded by the dielectric layer 25. UV light irradiating from the location above the protective sheet 43 is shielded by the protective sheet 43. The edge sealant 50 only receives UV radiation from the lateral side. Therefore, the edge sealant 50 adjacent to the electronic-ink layer 30 is difficult to be cured, and it requires longer time to fully solidify the edge sealant 50.

SUMMARY

An electronic-ink display apparatus is provided. The electronic-ink display apparatus includes a thin film transistor array substrate, an electronic-ink layer, a common electrode, a second substrate and an ultraviolet curable sealant. The thin film transistor array substrate includes a first substrate, plural thin film transistors, a dielectric layer and plural pixel electrodes. The thin film transistors are located on the first substrate. The dielectric layer is located on the first substrate and covers the thin film transistors. Each pixel electrodes is electrically connected to each thin film transistor. The electronic-ink layer, common electrode and the second substrate are located above the thin film transistor array substrate in sequence. The ultraviolet curable sealant surrounds the electronic-ink layer. At least one part of the ultraviolet curable sealant is not overlaid above the dielectric layer.

A method for manufacturing an electronic-ink display is provided. A thin film transistor array substrate is first formed. The thin film transistor array substrate includes a dielectric layer overlaid on part of the thin film transistor array substrate. An electronic-ink layer, a common electrode and a second substrate are formed above the thin film transistor array substrate in sequence. An ultraviolet curable sealant is further coated on a side wall of the electronic-ink layer. At least one part of the ultraviolet curable sealant is not overlaid above the dielectric layer. Finally, a curing reaction of the ultraviolet curable sealant is carried out.

A method for manufacturing an electronic-ink display is provided. A thin film transistor array substrate is first formed. The thin film transistor array substrate includes a first substrate and a dielectric layer overlaid on part of the thin film transistor array substrate. An electronic-ink layer, a common electrode and a second substrate are subsequently formed above the thin film transistor array substrate in sequence. An electromagnetic radiation curable sealant is further coated on a side wall of the electronic-ink layer. At least one part of the electromagnetic radiation curable sealant is not overlaid above the dielectric layer. The electromagnetic radiation curable sealant is irradiated with an electromagnetic radiation passing through the first substrate to carry out a curing reaction of the electromagnetic radiation curable sealant.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
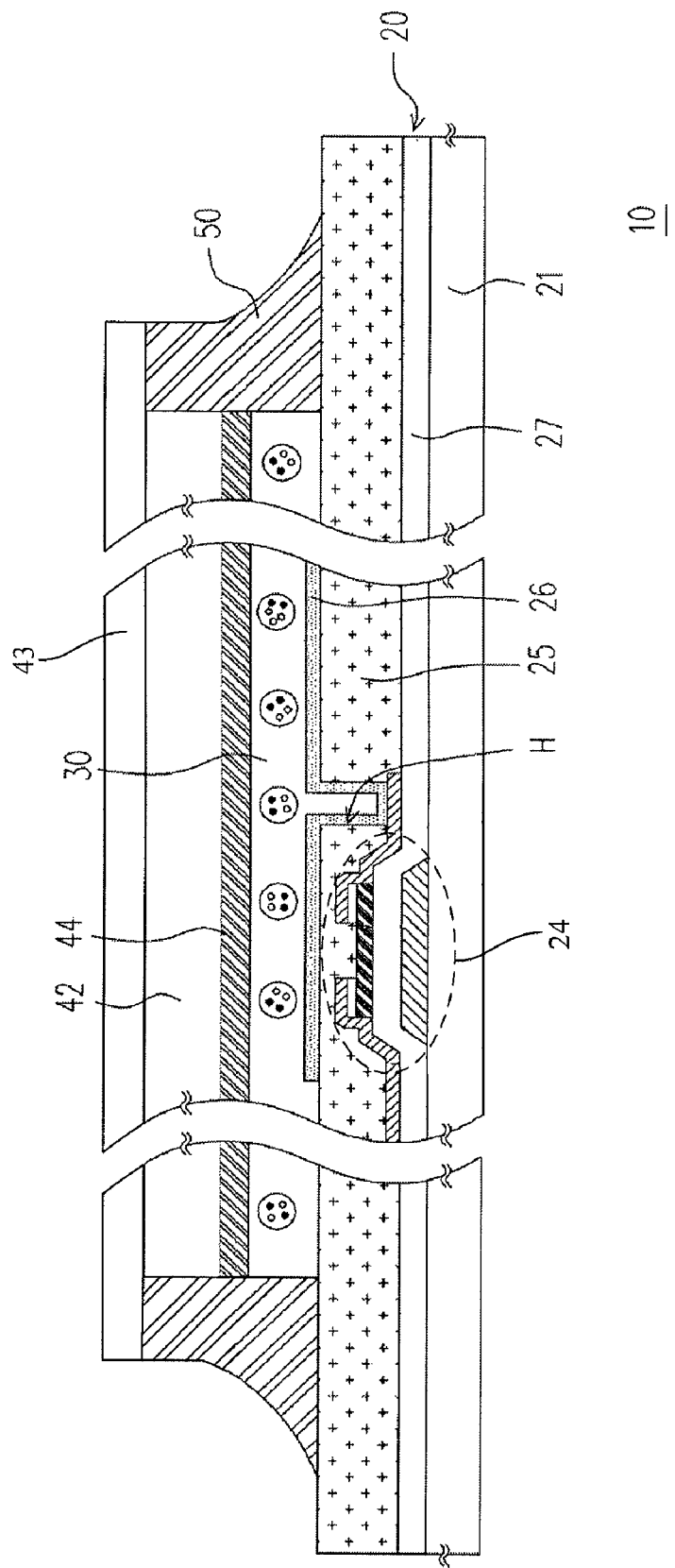
FIG. 1A is a cross-sectional view of a conventional electronic-ink display apparatus.
Figure 1B:
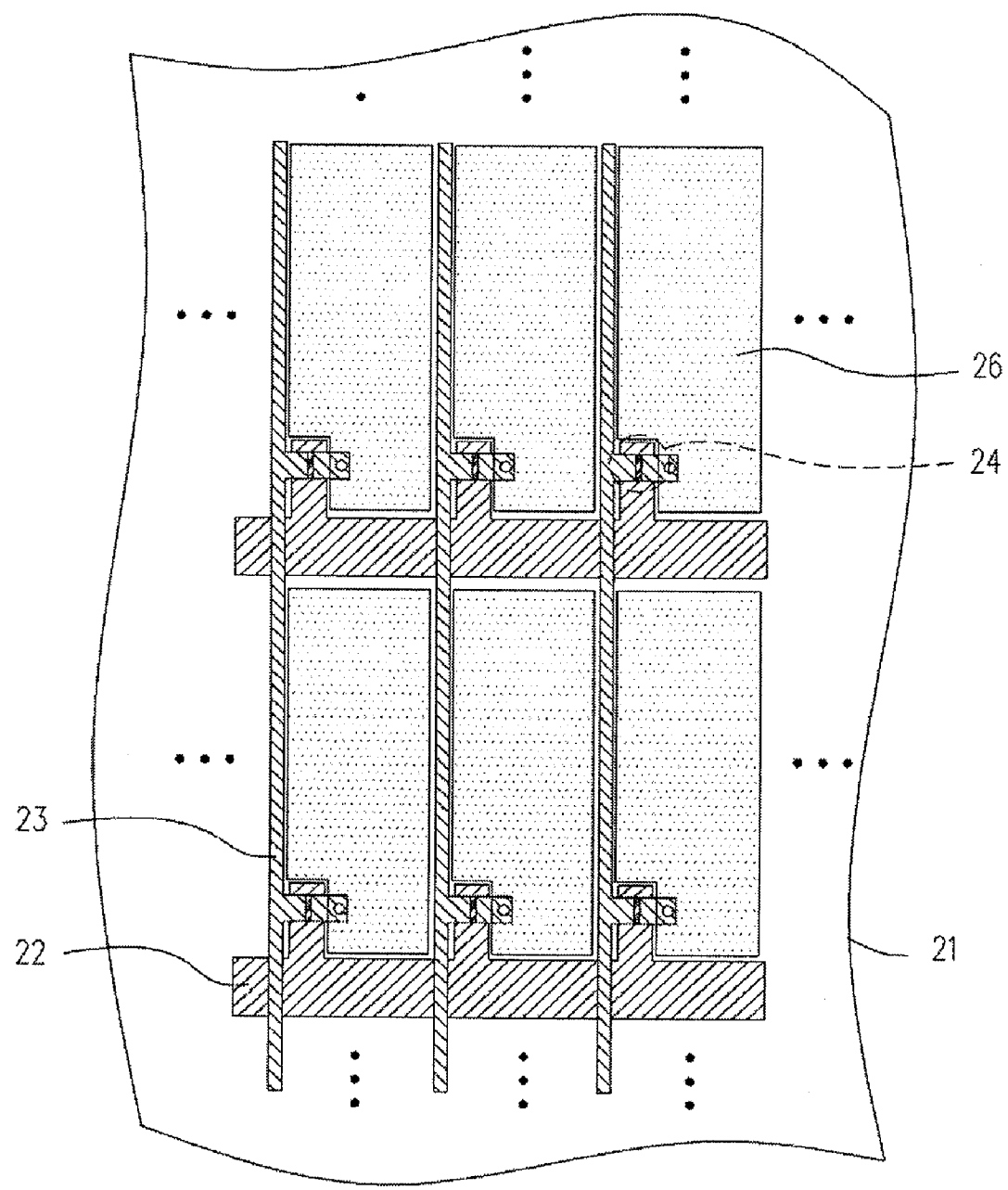
FIG. 1B is a vertical view of a thin film transistor array substrate of the electronic-ink display apparatus shown in FIG. 1A.
Figure 2A:
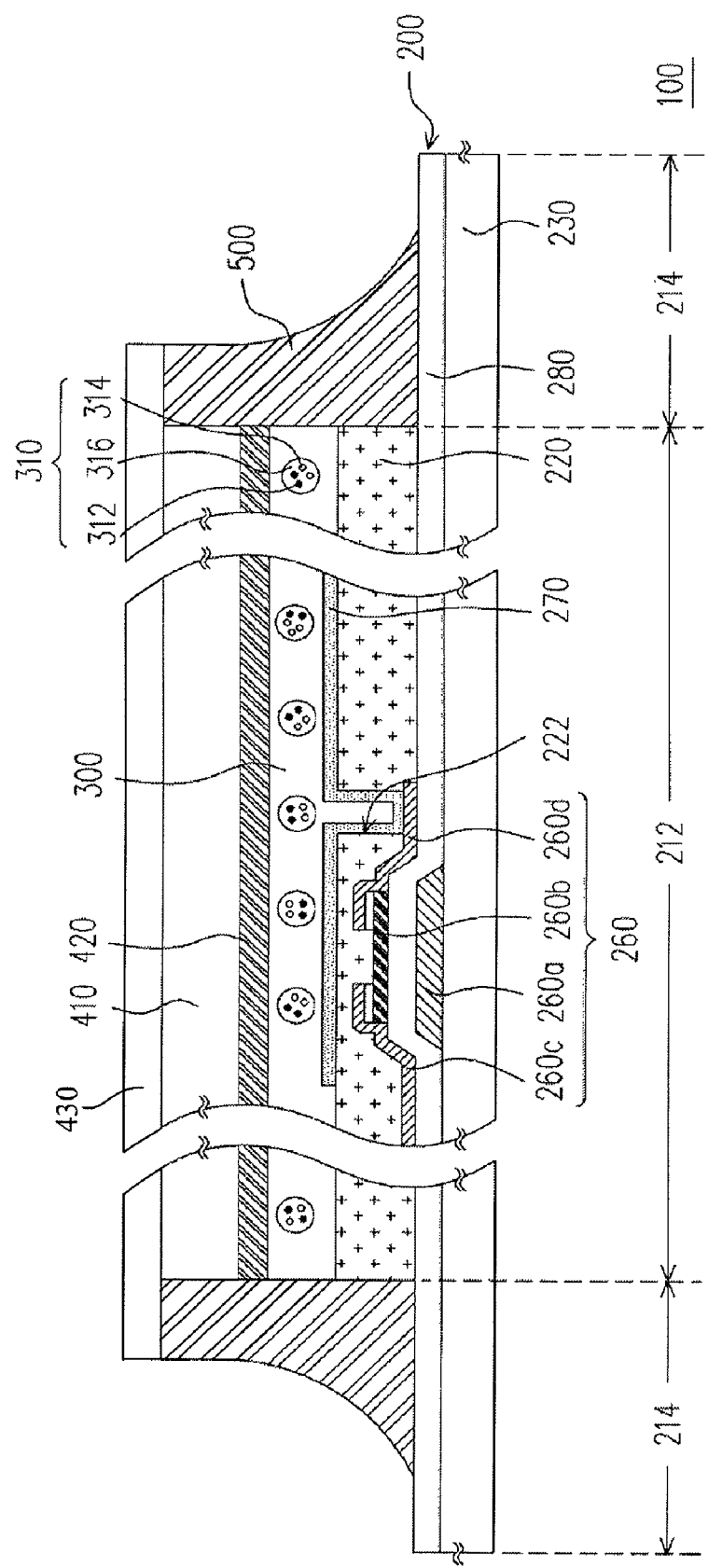
FIG. 2A is a cross-sectional view of an electronic-ink display apparatus according to one embodiment of the present invention.
Figure 2B:
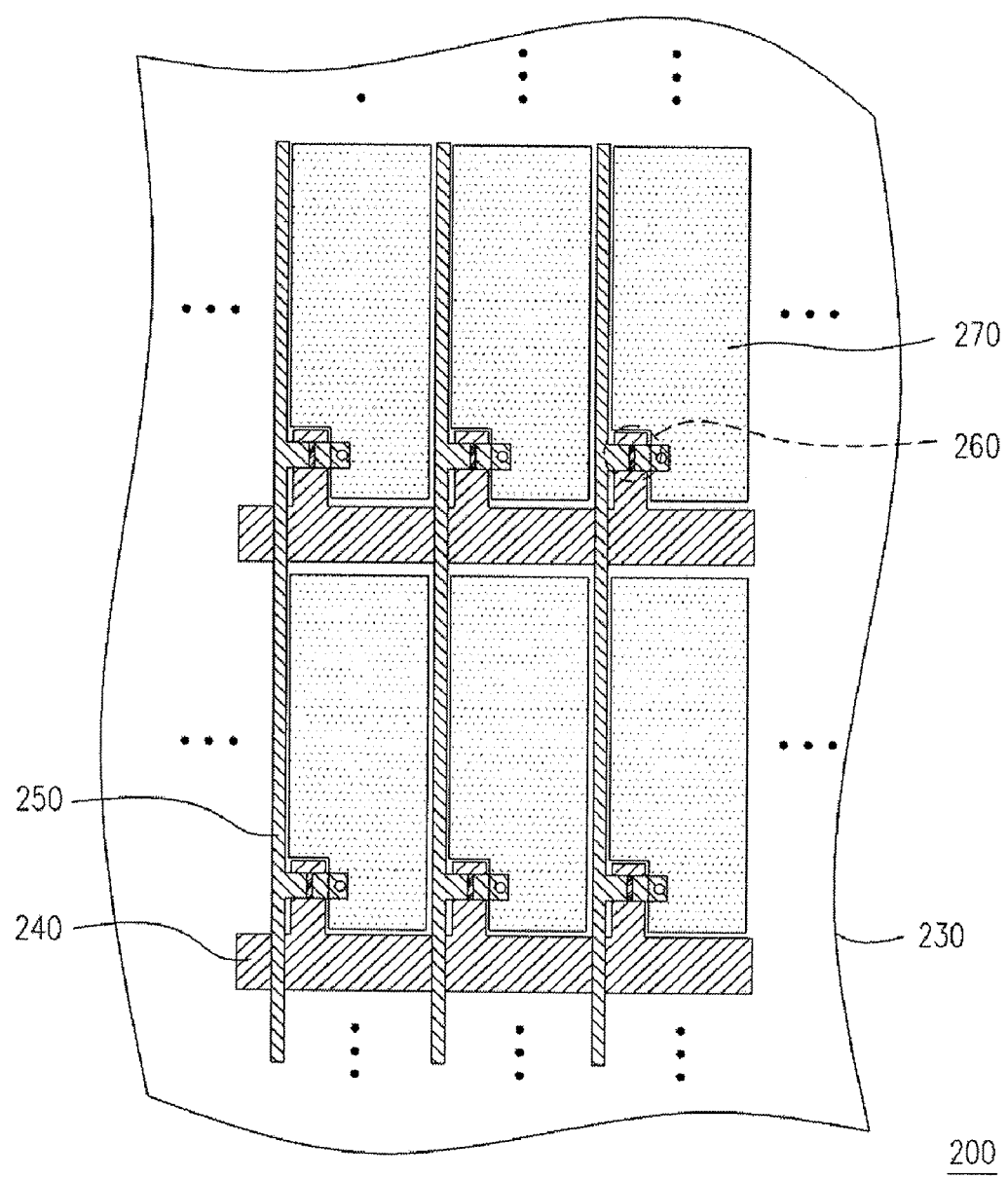
FIG. 2B is a vertical view of a thin film transistor array substrate of the electronic-ink display apparatus shown in FIG. 2A.

FIG. 2A shows a cross-sectional view of an electronic-ink display apparatus according to one embodiment of present invention. FIG. 2B shows a vertical view of a thin film transistor array substrate of the electronic-ink display apparatus shown in FIG. 2A. Referring to FIG. 2A and FIG. 2B, electronic-ink display apparatus includes a thin film transistor array substrate 200, an electronic-ink layer 300, a common electrode 420, a second substrate 410 and an edge sealant 500. The thin film transistor array substrate 200 includes an active region 212, a peripheral region 214 adjacent to the active region 212 and a dielectric layer 220 located in the active region 212. The dielectric layer 220 is made of a material capable of shielding electromagnetic radiation such as ultraviolet (UV) light. The electronic-ink layer 300 is located above the active region 212 of the thin film transistor array substrate 200. The common electrode 420 is located on the electronic-ink layer 300. The second substrate 410 is located on the common electrode 420. The edge sealant 500 is an electromagnetic radiation curable sealant such as UV curable sealant. The edge sealant 500 surrounds the electronic-ink layer 300, and at least one part of the edge sealant 500 are not overlaid above the dielectric layer 220.

The thin film transistor array substrate 200 includes a first substrate 230, plural scan lines 240, plural data lines 250, plural thin film transistors 260 and plural pixel electrodes 270. The scan lines 240, data lines 250 and thin film transistors 260 are located on the first substrate 230. Each thin film transistor 260 is electrically connected with each scan line 240 and each data line 250. The dielectric layer 220 covers the scan lines 240, data lines 250 and the thin film transistors 260. The dielectric layer 220 includes plural openings 222 located therein. Each opening exposes part of each thin film transistor 260. The pixel electrodes 270 are located on the dielectric layer 220. Each pixel electrode 270 is electrically connected to each thin film transistor 260 through the opening 222.

Each thin film transistor 260 given above includes a gate electrode 260a, a semiconductor layer 260b, a source electrode 260c, a drain electrode 260d and a gate insulating layer 280. The gate insulating layer 280 covers the gate electrode 260a of the thin film transistor 260. The semiconductor layer 260b is disposed on the gate insulating layer 280 located above the gate electrode 260a. The source electrode 260c and the drain electrode 260d are located on the semiconductor layer 260b. The source electrode 260c is electrically connected to the data line 250. The drain electrode 260d is electrically connected to the pixel electrode 270. The thin film transistor 260 described above is a bottom gate thin film transistor. The thin film transistor in the present invention also can be a top gate thin film transistor. The thin film transistor in the present invention is not limited to the thin film transistor described above.

The electronic-ink layer 300 includes plural electronic-ink particles 310. The electronic-ink particle 310 is made of a reflective display material having a bi-stable characteristic and using charged particles to provide display. Each charged particle may contain single polarity or both positive and negative polarities. Referring to FIG. 2A, each electronic-ink particle 310 has plural dark particles 312, bright particles 314 and a transparent fluid 316. The dark particles 312 and the bright particles 314 with different polarities are distributed in the transparent fluid 316. The dark particles 312, bright particles 314 and the transparent fluid 316 are packaged in a microcapsule to form an electronic-ink particle 310. When the electric field between the pixel electrode 270 and the common electrode 420 is altered, the dark particles 312 and the bright particles 314 move upward and downward respectively, so different color can be showed in each pixel. According to another embodiment of the present invention, the dark particles 312, bright particles 314 and transparent fluid 316 are disposed in plural microcups (not shown in the figure). The electronic-ink particle 310 in the embodiment of the present invention is not limited to the structure given above.

The edge sealant 500 surrounding the electronic-ink layer 300 can be adhered to the side wall of the electronic-ink layer 300. The side wall of the electronic-ink layer 300 can be approximately aligned with the side wall of the dielectric layer 220. The second substrate 410 can be a transparent film capable of shielding UV light. A protective sheet 430 capable of shielding UV light can further be disposed on the second substrate 410.

The manufacturing method of the electronic-ink display apparatus 100 is provided as follows: A front plane laminate including the electronic-ink layer 300, common electrode 420 and second substrate 410 is disposed above the thin film transistor array substrate 200. A protective sheet 430 slightly larger than second substrate 410 is selectively disposed on the front plane laminate and covers the front plane laminate. The edge sealant 500 is coated on the side wall of the electronic-ink layer 300 and surrounds the electronic-ink layer 300. Finally, the edge sealant 500 is irradiated with an electromagnetic radiation from the location below the thin film transistor array substrate 200 to carry out the curing reaction of the edge sealant 500. The forming method of the electronic-ink layer 300, common electrode 420 and second substrate 410 is not limited to the description given above.

Figure 2C:
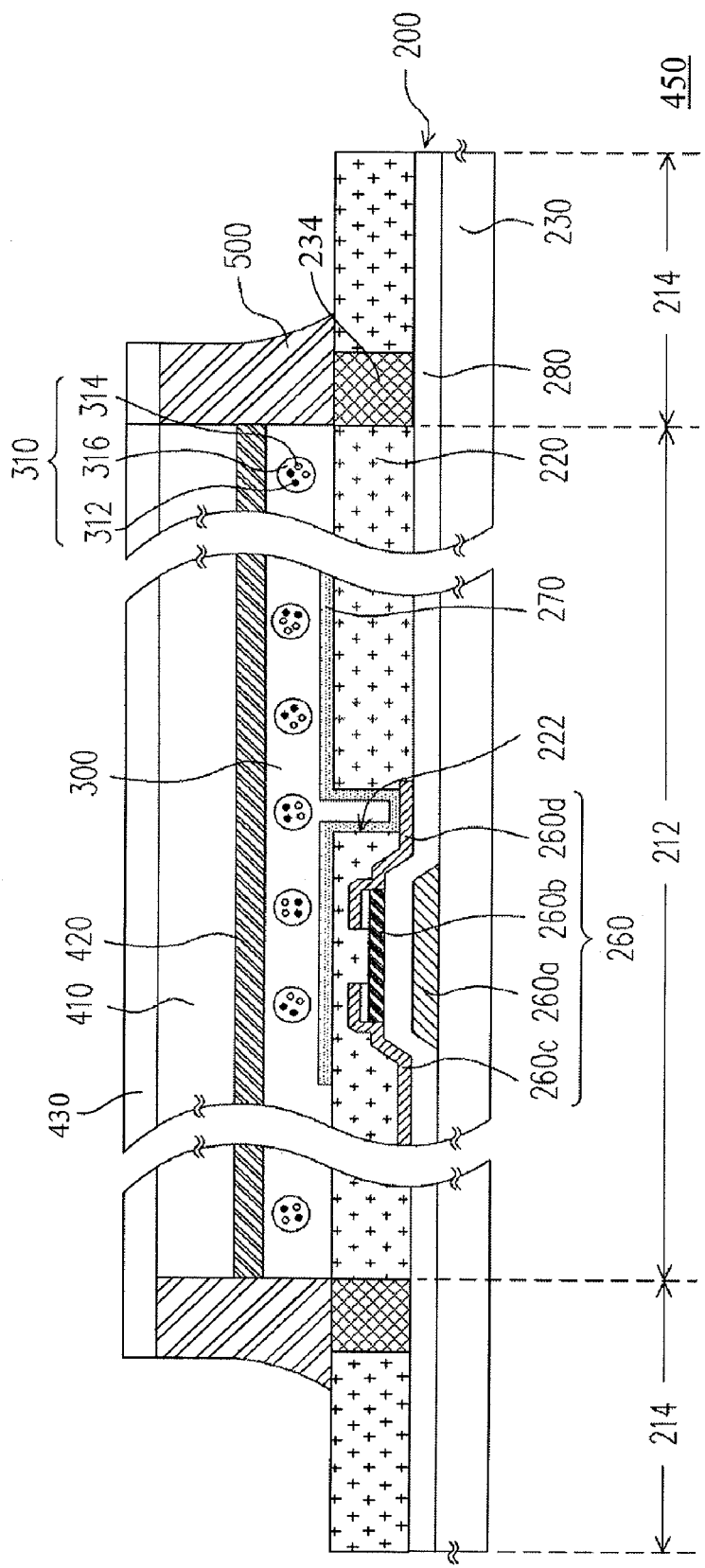
FIG. 2C is a cross-sectional view of an electronic-ink display apparatus according to other embodiment of the present invention.
Figure 2D:
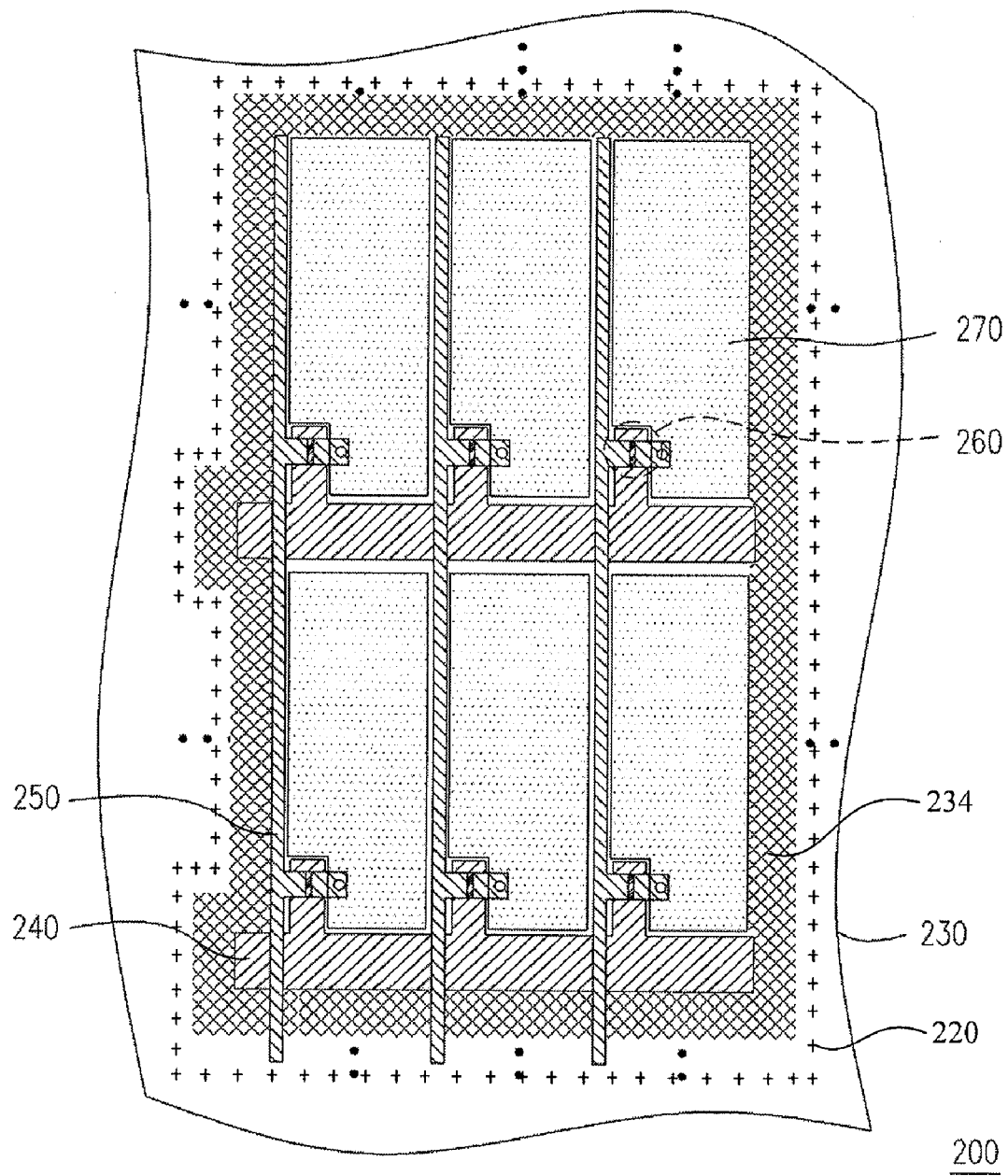
FIG. 2D is a vertical view of a thin film transistor array substrate of the electronic-ink display apparatus shown in FIG. 2C.

FIG. 2C shows a cross-sectional view of an electronic-ink display apparatus according to other embodiment of the present invention. FIG. 2D shows a vertical view of a thin film transistor array substrate of the electronic-ink display apparatus shown in FIG. 2C. Referring to FIG. 2C and FIG. 2D, the manufacturing method of the electronic-ink display apparatus 450 is similar to the manufacturing method of the electronic-ink display apparatus 100 shown in FIG. 2A. The dielectric layer 220 is extended outward and the side wall of the dielectric layer 220 is not aligned with the side wall of the electronic-ink layer 300. A patterning dielectric layer 234 is located under the edge sealant 500. When the curing reaction of the edge sealant is carried out with an electromagnetic radiation (e.g. UV light radiation) from the location below the thin film transistor array substrate 200, the electromagnetic radiation can pass through the patterning dielectric layer 234 and irradiate the edge sealant 500. At least one part of the edge sealant 500 is not overlaid above the dielectric layer 220 when the patterning dielectric layer 234 is formed.

According to embodiments given above, at least one part of the edge sealant 500 is not overlaid above the dielectric layer 220 when the side wall of the dielectric layer 220 is aligned with the electronic-ink layer 300 (FIG. 2A), or when the dielectric layer 220 located under the edge sealant 500 is patterned (FIG. 2C). Therefore, the electromagnetic radiation such as UV light radiation used for carrying out the curing reaction of the edge sealant 500 can be irradiated from the location below the first substrate 230, and is not totally shielded by the dielectric layer 220. The edge sealant 500 can receive sufficient electromagnetic radiation and be fully cured by the electromagnetic radiation. It can obtain the electronic-ink display apparatus with improved reliability.

Figure 3A:
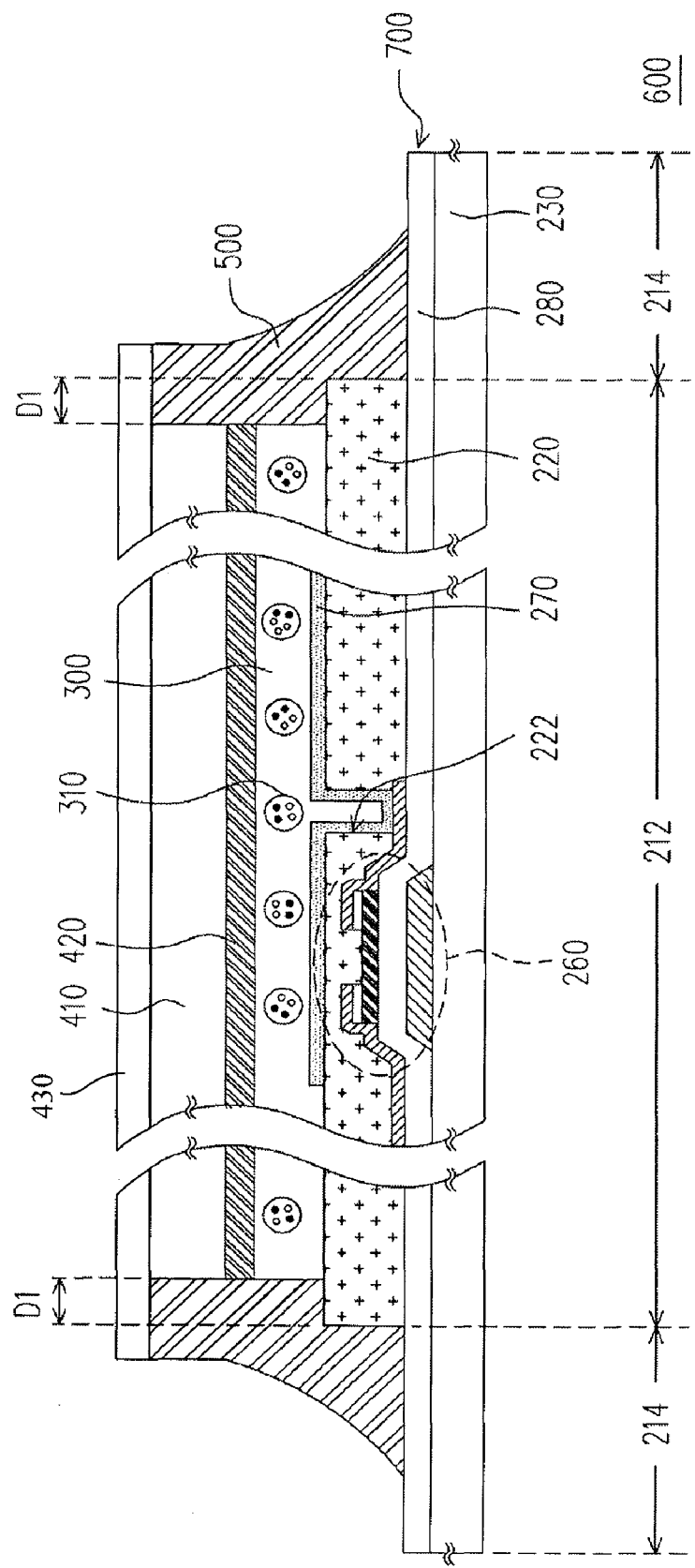
FIG. 3A is a cross-sectional view of an electronic-ink display apparatus according to other embodiment of the present invention.
Figure 3B:
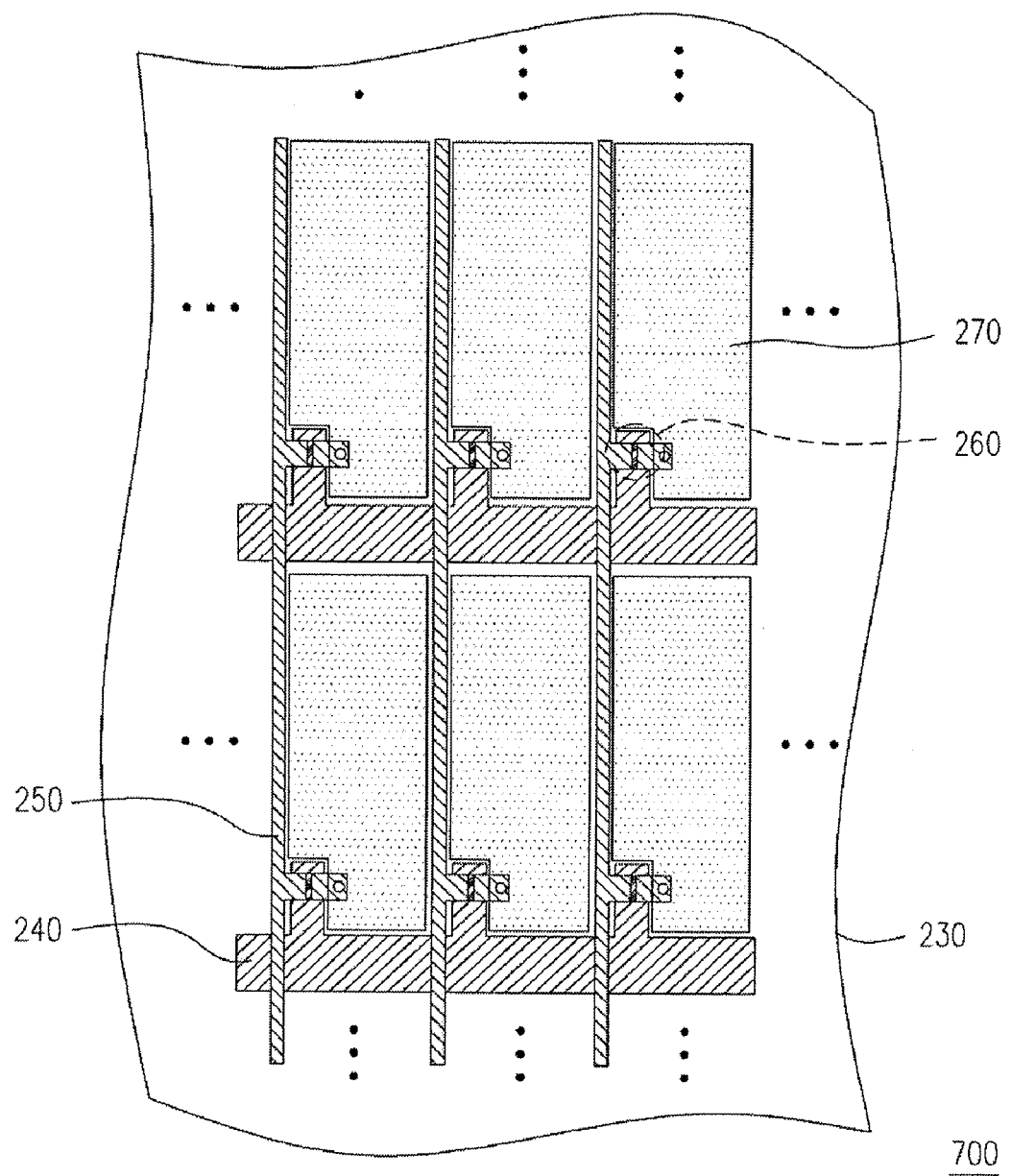
FIG. 3B is a vertical view of a thin film transistor array substrate of the electronic-ink display apparatus shown in FIG. 3A.

FIG. 3A shows a cross-sectional view of an electronic-ink display apparatus according to other embodiment of the present invention. FIG. 3B shows a vertical view of a thin film transistor array substrate of the electronic-ink display apparatus shown in FIG. 3A. Referring to FIG. 3A and FIG. 3B, the electronic-ink display apparatus 600 is similar to the electronic-ink display apparatus 100 shown in FIG. 2A. The major difference between the electronic-ink display apparatus 600 and 100 is that the electronic-ink layer 300 is shorter, by two predetermined distance D1, than the dielectric layer 220. The predetermined distance D1 is about 0~1500 micrometer.

The edge sealant 500 of the electronic-ink display apparatus 600 can receive sufficient electromagnetic radiation (e.g. UV light radiation) energy even though the electromagnetic radiation is irradiated from the location below the first substrate 230. Therefore, the edge sealant 500 can be fully cured by the electromagnetic radiation.

Accordingly, each part of the edge sealant of the electronic-ink display apparatus given above can receive sufficient electromagnetic radiation to carry out the curing reaction. The edge sealant can be fully cured by the electromagnetic radiation. It can further obtain an electronic-ink display with improved reliability.

Although the present invention has been described in considerable detail with reference to certain embodiments thereof, other embodiments are possible. Therefore, their spirit and scope of the appended claims should no be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic-ink display apparatus, comprising:
   a thin film transistor array substrate, wherein the thin film transistor array substrate comprises:
      a first substrate;
      a plurality of thin film transistors located on the first substrate;
      a dielectric layer located on the first substrate and covering the thin film transistors, wherein the dielectric layer can shield UV light; and
      a plurality of pixel electrodes located on the dielectric layer, wherein each of the pixel electrodes is electrically connected to each of the thin film transistors;
   an electronic-ink layer located on the thin film transistor array substrate, wherein electronic-ink particles in the electronic-ink layer are made from reflective display material;
   a common electrode located on the electronic-ink layer;
   a second substrate located on the common electrode;
   a protective sheet totally covering the second substrate, wherein the protective sheet can shield UV light; and
   an ultraviolet curable sealant surrounding the electronic-ink layer and located under the protective sheet and above the first substrate, wherein at least one part of the ultraviolet curable sealant is not overlaid above the dielectric layer.

2. The electronic-ink display apparatus of claim 1, wherein the dielectric layer comprises a plurality of openings located therein, each opening exposes part of each thin film transistor, each thin film transistor and each pixel electrode are electrically connected through the opening.

3. The electronic-ink display apparatus of claim 1, wherein a side wall of the electronic-ink layer is approximately aligned with a side wall of the dielectric layer.

4. The electronic-ink display apparatus of claim 1, wherein the ultraviolet curable sealant is adhered to a side wall of the electronic-ink layer.

5. The electronic-ink display apparatus of claim 1, wherein the dielectric layer located under the ultraviolet curable sealant is a patterning dielectric layer.

* * * * *